United States Patent [19]

Gorina et al.

[11] 4,115,163

[45] Sep. 19, 1978

[54] METHOD OF GROWING EPITAXIAL SEMICONDUCTOR FILMS UTILIZING RADIANT HEATING

[76] Inventors: Yulia Ivanovna Gorina, Polyarnaya ulitsa, 8, kv. 100; Galina Alexandrovna Kaljuzhnaya, Universitetsky prospekt 6, kor. 2, kv. 102; Andrei Vasilievich Kuznetsov, ulitsa Vavilova, 45, kv. 24; Sergei Nikolaevich Maximovsky, Leningradskoe shosse, 118, kv. 63; Mikhail Borisovich Nikiforov, ulitsa Vavilova, 72, kv. 12; Bentsion Moiseevich Vul, ulitsa Vavilova 44, kor. 4, kv. 139; Galina Evgenievna Ivannikova, Okskaya ulitsa 12, kor. 1, kv. 75, all of Moscow; Vintsentas Ionovich Denis, ulitsa Suvalku, 8, kv. 3, Vilnjus; Mikolas Mikolo Yarmalis, ulitsa Mintes, 5, kv. 34, Vilnjus; Vitautas Ionovich Repshis, ulitsa Dzerzhinskogo, 48/2, kv. 4, Vilnjus, all of U.S.S.R.

[21] Appl. No.: 647,327

[22] Filed: Jan. 8, 1976

[51] Int. Cl.² ........................................ H01L 21/205
[52] U.S. Cl. .................... 148/175; 118/49.5; 148/1.5; 156/610; 156/611; 156/612; 250/492 A; 427/54; 427/55; H01L/21/26
[58] Field of Search ............... 156/610, 611, 612; 148/1.5, 174, 175; 118/49.5; 427/54, 55, 95; 250/492 A, 493

[56] References Cited

U.S. PATENT DOCUMENTS

| | | |
|---|---|---|
| 3,047,438 | 7/1962 | Marinace .................. 148/175 X |
| 3,208,888 | 9/1965 | Ziegler et al. ............. 148/175 |
| 3,218,204 | 11/1965 | Ruehrwein ............... 148/175 |
| 3,369,989 | 2/1968 | Kay et al. ............... 118/49.5 X |
| 3,392,066 | 7/1968 | McDermott et al. ....... 148/175 |
| 3,619,282 | 11/1971 | Manley et al. ........... 148/175 X |
| 3,619,283 | 11/1971 | Carpenter et al. ....... 148/175 X |
| 3,627,590 | 12/1971 | Mammel .................. 148/175 X |
| 3,661,637 | 5/1972 | Sirtl ...................... 148/175 X |
| 3,862,397 | 1/1975 | Anderson et al. ......... 118/49.5 |
| 3,873,341 | 3/1975 | Janus .................... 427/54 X |
| 3,877,418 | 4/1975 | Shaner .................. 118/642 |

OTHER PUBLICATIONS

Powell, C. F., "*Vapor Deposition,*" (Textbook), John Wiley & Sons, Inc., New York, N.Y., 1966, pp. 263-267.
Thomas et al., "Impurity Distribution in Epitaxial Silicon Films," J. Electrochem. Soc., vol. 109, No. 11, Nov. 1962, pp. 1055-1061.
Runyan, W. R., "Silicon Semiconductor Technology'-'—Textbook McGraw-Hill Book Co., Jul. 1965, pp. 69-73.

*Primary Examiner*—R. Dean
*Assistant Examiner*—W. G. Saba
*Attorney, Agent, or Firm*—Lackenbach, Lilling & Siegel

[57] ABSTRACT

A method of growing epitaxial semiconductor films on substrates is proposed which consists in that a substrate is cleaned from damage layers and heated to a critical epitaxy temperature simultaneously by irradiating a substrate surface with an intensive luminous flux. A source material for growing a film is introduced to the substrate in a gaseous state. When producing multilayer semiconductor structures, a substrate surface opposite to a surface exposed to the luminous flux is cooled to a temperature sufficient to prevent mutual diffusion between the film and the substrate materials. Versions of an apparatus for carrying this method into effect are also proposed. The apparatus includes a quartz chamber with a vaporizer for vaporizing the source material for film growing, a means for supporting the substrate and openings for introducing a neutral or reducing agent. The apparatus is provided with furnaces for heating the walls of the chamber. Each apparatus has a powerful light source disposed outside the chamber so as to face a working surface of the substrate support.

5 Claims, 4 Drawing Figures

METHOD OF GROWING EPITAXIAL SEMICONDUCTOR FILMS UTILIZING RADIANT HEATING

This invention relates to production of semiconductor materials and more particularly to ways of growing semiconductor films on substrates by the gas epitaxy method for producing multi-layer structures extensively used in microelectronics, and to apparatuses therefore.

The following ways of growing epitaxial films are available at present: (1) a liquid epitaxy method; (2) a vapor phase epitaxy method.

With the liquid epitaxy method, it is possible to produce semiconductor structures by successive growing of layers of semiconductor films.

However, the liquid epitaxy method permits manufacture of semiconductor films of limited composition only: when growing GaAs films from a Ga solution, the films have an excess of Ga, when PbTe films are grown from a Pb solution, an excess of Pb is observed, CdTe films grown from a Cd solution possess an excess of Cd; i.e. in all the cases an excess of vacancies of As, Te, etc. takes place. The latter circumstance permits only production of films with a certain type of conductivity and a certain concentration of the carriers and does not allow variations in the carrier concentration within a broad range on account of a deviation of the composition from stoichiometric.

The vapor phase epitaxy method is successfully used for growing epitaxial films having the formulations of the type $A_2B_6$, for example HgCdTe (see, for example, U.S. Pat. Nos. 3,619,282; 3,619,283 and 3,642,529).

The vapor phase epitaxy method consists of the steps of precleaning the substrate from products of previous runs by mechanical or chemical polishing and positioning the substrate in a quartz chamber on a working surface of the substrate support. External heating sources (resistance furnaces of high-frequency heaters) heat the working space of the quartz chamber and the substrate to a critical epitaxy temperature.

This causes vaporizing of the constituent elements from the sources, and the substance for film growing is supplied in a gaseous state to the epitaxial surface of the substrate.

This method, however, is not suitable for epitaxial growing of multi-layer structures from the compounds $A_2B_6$ and $A_4B_6$ and their solid solutions due to vigorous diffusion of inherent point defects and impurities from the film into the substrate and back which causes blurring of the junctions and formation of intermediate solid solutions.

The rate of growth of epitaxial structures by the vapor epitaxy method is low and usually ranges from 2 to 3 $\mu$/hr for $A_4B_6$ compounds and up to 250 $\mu$/hr for HgCdTe compounds.

It is an object of the invention to provide a means for growing semiconductor films and multi-layer structures with well defined junctions from elemental and compound semiconductor materials by the gaseous phase method.

It is another object of the invention to provide a method which increases the rate of epitaxial growth of a monocrystalline film with good structural properties.

It is the third object of the invention to provide a method which makes it possible to suppress diffusion processes from the film into the substrate and back and results in well defined junctions in grown structures.

It is the fourth object of the invention to provide a method which checks deviations from the stoichiometric composition of the film, i.e. to produce films with desired electro-physical properties.

It is the fifth object of the invention to provide a method which precleans a surface of a substrate directly in an epitaxial chamber before epitaxial growth occurs.

It is the sixth object of the invention to provide a cheap and simple apparatus for this process of manufacture.

To accomplish the foregoing objects, there is provided a method of growing epitaxial semiconductor films on substrates by the vapor phase epitaxy method comprising the steps of cleaning the substrate from products of previous runs, heating it to a critical epitaxy temperature and introducing a source material for growing a film in a gaseous state on the substrate, whereby, according to the invention, cleaning and heating of the substrate are effected simultaneously by exposing a surface of the substrate intended for epitaxial growth to a luminous flux of the intensity of $10^1 - 10^4$ W/sq cm while simultaneously introducing the material for film growing to the substrate.

When using semiconductor material substrates, a surface of the substrate opposite to the surface exposed to the light flux should be cooled to a temperature sufficient to prevent mutual diffusion between the film and substrate substances.

Also to accomplish the foregoing objects, there is provided an apparatus for carrying the above method into effect, comprising a quartz chamber accommodating a vaporizer for the film material, a means for supporting a growth substrate and an opening for a neutral or reducing agent, a furnace for heating the walls of the chamber, a light source disposed outside the chamber opposite a working surface of the substrate support adapted for supporting the substrate, and the quartz chamber wall located between the light source and the substrate support made of optically transparent quartz.

If compounds of the formulations $A_2B_6$ and $A_4B_6$ are used for film growing on semiconductor substrates, it is preferable that a substrate support be made as a movable member which, when set to one of its extreme positions, partitions the quartz chamber into two airtight spaces, first being a working space for epitaxial growth and accommodating a vaporizer for the film growing material, while a second space contains a second quartz chamber which is sealed from the space and communicates with a coolant source and with the atmosphere, one wall of this second chamber being a surface of a substrate support opposite to the working surface.

The main advantages of the present invention are as follows:

(1) Heating a surface of a substrate with a powerful light flux removes from this surface oxide films, adsorbed atoms and layers mechanically damaged during polishing, i.e. makes it possible to prepare a perfect epitaxial surface in one process.

(2) A powerful polychromatic luminous flux with a wavelength of 0.2–8 $\mu$ and power of $10^1 - 10^4$ W/sq cm acting on the surface of the substrate activates both the surface of the substrate and the gas space which results in an increase of the rate of growth of epitaxial monocrystalline films due to photochemical processes. Thus, the rate of growth for Si is 180–220 $\mu$/hr, for CdTe — 800–1000 $\mu$/hr, for PbTe and PbSnTe — 150–200 $\mu$/hr, i.e. the rate of growth is several times higher as compared with known methods of epitaxial film growth.

(3) The combination of a powerful light flux acting on the epitaxial surface of the substrate and forced cooling of the opposite side of the substrate helps suppress diffusion processes from the substrate into the film and back, i.e. provides favorable conditions for producing multilayer semiconductor structures.

(4) The use of a closed quartz chamber with systems for measuring the composition of a gaseous mixture in the apparatus makes it possible to produce epitaxial films of complex semiconductor compounds not only with a desired stoichiometric composition, but also with a preset concentration of the carriers and the type of conductivity.

The invention may be more fully understood from the following detailed description of preferred embodiments thereof when read with reference to the accompanying drawings, in which.

Figure 1:
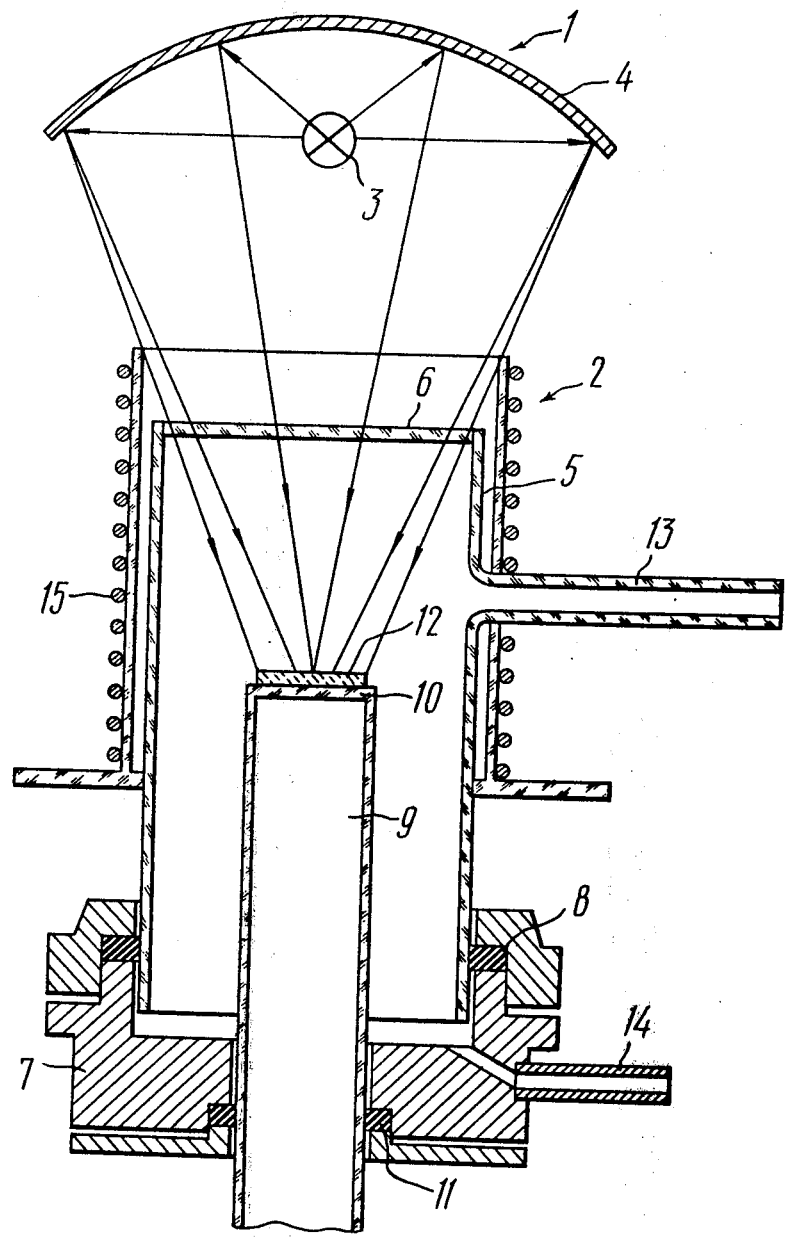
FIG. 1 is a schematic view of an apparatus for growing semiconductor films by the vapor epitaxy method in a flow-type system, in accordance with the invention.

A device for growing semiconductor films illustrated in FIG. 1 consists of an optical heating assembly 1 and a reaction furnace 2 for growing epitaxial layers.

The optical heating assembly 1 is a setup comprising a light source 3 which is a high-pressure xenon lamp of about 10 kW power and a focusing system with an elliptical reflector 4.

The optical heating assembly 1 must heat the surface of the substrate intended for epitaxy up to critical epitaxy temperatures which, as a rule, are equal to about 0.7 of the substrate material melting point.

The intensity of the luminous flux emitted from the xenon lamp must be variable through varying focusing of the optical heating assembly 1 or the operating current of the lamp within $10^1 - 10^4$ W/sq cm of the substrate surface area which permits heating of the surface of any substrate, including semiconductor substrates, up to critical epitaxy temperatures.

The reaction furnace 2 for growing epitaxial films in a flow-type system is a quartz chamber 5 made in the form a tube sealed from the side facing the optical heating assembly 1 with a quartz glass 6 transparent for the intensive luminous flux which can thereby pass from the assembly 1 to the inside of the quartz chamber 5. On the opposite side, the quartz chamber 5 joins with a cylindrical metal section 7 at an airtight packing ring 8. The reaction furnace 2 comprises also a substrate support 9 which is a quartz tube of a smaller diameter than the quartz chamber 5 and is inserted in coaxial configuration inside the quartz chamber 5. The end of this inner tube facing the light source 3 is sealed with polished quartz glass which serves as a working surface 10 of the substrate support 9.

The other end of the tube projects outside the quartz chamber 5, the interior of the quartz chamber 5 being made airtight by means of a Wilson seal 11.

Referring to FIG. 1, a substrate 12 is placed on the working surface 10 of the support. The substrate 12 may be any material selected on the principle of crystallographic affinity for the grown film.

The wall of the quartz chamber 5 has a quartz tube 13 soldered into it. The quartz tube 13 is connected through an air-tight seal with a vaporizer of the source substance for film growing and with a source of a neutral or reducing agent (the evaporator and source are not shown in FIG. 1) for introducing a gaseous mixture containing film source material and hydrogen (or other inert gas) into the quartz chamber 5.

Venting of the carrier gas from the quartz chamber 5 is provided by a tube 14 built into the cylindrical metal section 7.

The heating of the walls of the quartz chamber 5 is effected by a resistance furnace 15 located on the external side surface of the chamber 5.

Figure 2:
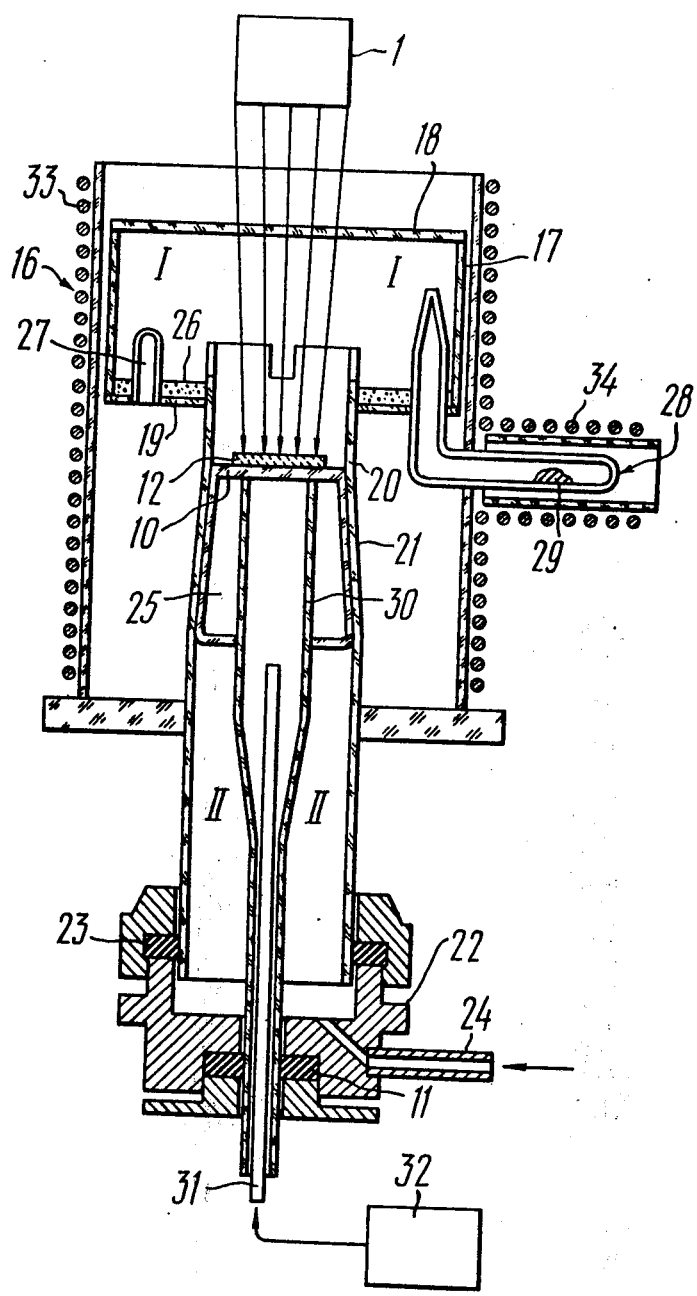
FIG. 2 is a schematic view of an apparatus for growing semiconductor films by the vapor epitaxy method in a closed system, in accordance with the invention.

FIG. 2 illustrates an apparatus for epitaxial growing of films in a closed system which comprises the same optical heating assembly 1 and a reaction furnace 16. The reaction furnace 16 is a quartz chamber made in the form of a shortened quartz tube 17 sealed from the side of the optical heating assembly 1 by a quartz glass 18. On the opposite side, the quartz tube 17 has a pedestal 19 into which is welded in coaxial configuration a smaller-diameter quartz tube 20 with a conical expansion 21 outside the tube 17. From the side of the tube 17, the tube 20 is open and the interiors of both tubes communicate. From the opposite side, the tube 20 is connected with a cylindrical metal section 22 through a rubber seal 23. A tube 24 soldered into the cylindrical metal section 22 serves for introducing hydrogen or inert gas into the reaction furnace 16 or for evacuation of the chamber. A support 25 of the substrate 12 is made in the form of a movable manner — a conical quartz piece which, when set to one of its extreme positions, interacts with the conical expansion 21 to partition the quartz chamber into two airtight spaces I and II. The space I is an epitaxial growing space. A surface of the conical quartz piece adjacent to the space I is the working surface 10 of the substrate support 25 and is made from polished quartz glass.

In the space I, the pedestal 19 which serves as a vaporizer is designed for accommodating material 26 of the film to be grown. A wall of the space I is fitted with a built-in well 27 for a thermocouple to measure the temperature of the vaporizing material, and a Knudsen cell 28 which is a tube sealed at one end (FIG. 2 shows only one Knudsen cell, however, several such cells 28 may be used) and having an outlet diameter of about 0.1 mm for preventing back diffusion from the space. The Knudsen cell 28 contains a volatile constituent element 29 for checking the stoichiometric composition of the grown film or for alloying thereof.

The second space II contains a second quartz chamber 30 hermetically sealed with respect to the space II. The chamber 30 is a tube with one end thereof welded to a surface of the substrate support 25 opposite to the working surface 10. The other open end of the chamber 30 passes through the base of the metal cylindrical section 22 and communicates with the atmosphere. The space II is made airtight by means of the Wilson seal 11. The open end of the tube 30 is also connected with a tube 31 coupled to a coolant source 32.

A heating furnace 33 is provided in the conical expansion 21 along the outside walls of the tube 17 and the tube 20 for heating the walls of the space I and the substrate support 25. The Knudsen cell 28 is heated with a furnace 34 located on the outside surface thereof.

Figure 3:
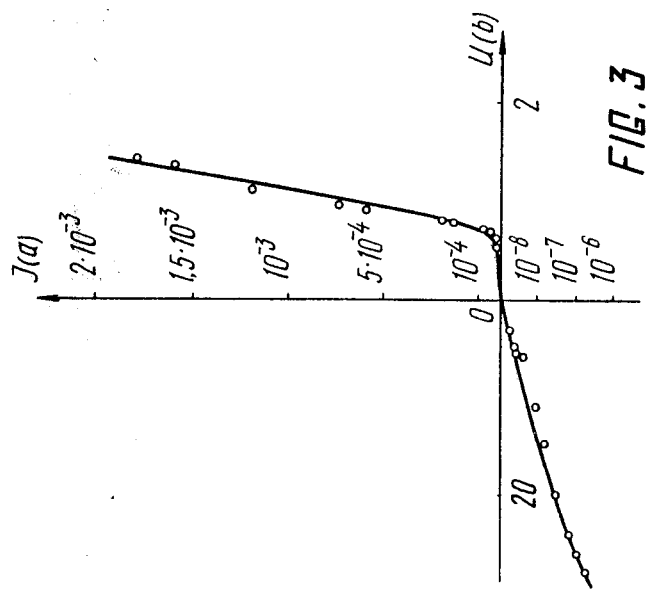

FIG. 3 is a current-voltage characteristic $I = f(U)$ of a n-p junction produced when growing an n-type CdTe film doped with In on a p-type CdTe substrate with a concentration of the carriers of $4.10^{16}$ cm$^{-3}$.

Figure 4:
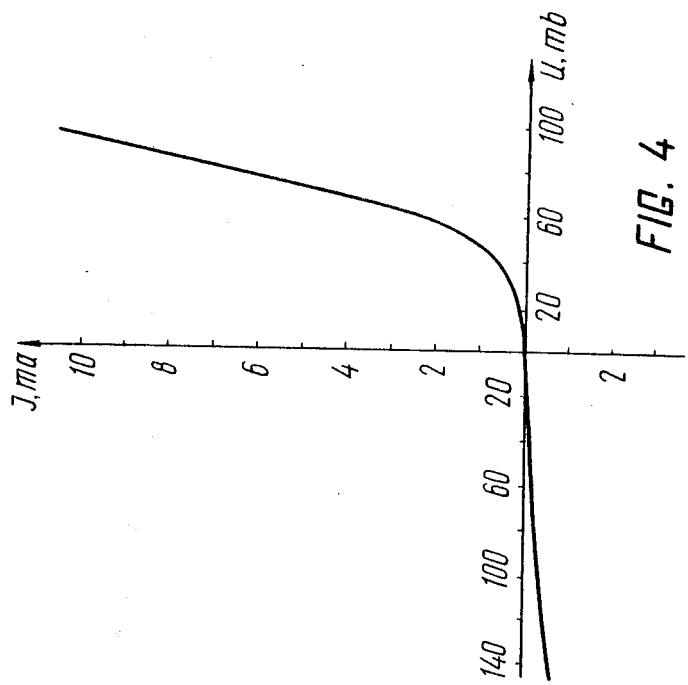
FIGS. 3 and 4 are current-voltage characteristics of structures grown by the method according to the invention.

FIG. 4 is a current-voltage characteristics $I=f(U)$ of a n-p junction produced when growing a n-type $Pb_{0.8}Sn_{0.2}Te$ film doped with Bi on a p-type $Pb_{0.8}Sn_{0.2}Te$ substrate with a concentration of the carriers of $5.10^{17}$ $cm^{-3}$.

The proposed method for growing epitaxial semiconductor films on semiconductor and other substrates will become clear from description of the apparatuses illustrated in FIG. 1 and FIG. 2.

An apparatus for epitaxial growing of semiconductor films in a flow-type system shown in FIG. 1, in accordance with the first embodiment of the invention, operates as follows.

The substrate 12 which may be a plate of any material with a crystallographic structure close to the grown film, for instance, oriented sapphire and spinel monocrystals or silicon for silicon films, is located on the working surface 10 of the substrate support 9. The reaction furnace 2 is made airtight. The furnace 15 is started up and the reaction furnace 2 is blown through the tubes 13 and 14 with an inert gas for air elimination. Then, the reaction furnace 2 is filled with a neutral or reducing agent through the tube 13. After that the light source 3 is turned on to heat the surface of the substrate 12 to a critical epitaxy temperature. The intensity of the luminous flux is selected in the range from $10^1$ to $10^4$ W per square centimeter of the substrate 12.

The intensity of the luminous flux below $10^1$ W/sq cm fails to appreciably increase the rate of film growth and does not practically affect the vapor epitaxy process.

The intensity of the luminous flux above $10^4$ W/sq cm is objectionable, since this may involve temperatures corresponding to the substrate material boiling temperatures which cause destruction of the substrate.

The optimum intensity of the luminous flux in the above range depends on the chemical nature of the material used for the substrate and is, for example, as follows:

for silicon — $10^3$ W/sq cm,
for CdTe — $10^2$ W/sq cm,
for HgCdTe — $10^1 - 10^2$ W/sq cm,
for SiC — $10^3 - 10^4$ W/sq cm.

As the surface of the substrate 12 is heated to a critical epitaxy temperature, it is simultaneously cleaned from products of previous runs. Simultaneously with heating the substrate 12 with an intensive luminous flux from the light source 3, the source substance for film growth is supplied to the substrate 12 via the tube 13, and an epitaxial semiconductor film of a desired composition is produced on the surface of the substrate 12 which has been cleaned from products of previous runs and heated to a critical epitaxy temperature.

The operation of the apparatus in a flow-type system will be illustrated in greater detail by the example of growing an epitaxial silicon film on a high-resistance silicon substrate for providing a non-injecting contact of current carriers in electric fields at a field intensity of above 10 KV/cm.

EXAMPLE 1

A silicon plate (substrate 12) polished chemically or mechanically was placed in the reaction furnace 2 onto the surface 10 of the support 9. The quartz reaction chamber 5 was blown through with argon to remove air, filled with pure hydrogen and then the silicon plate was exposed to a concentrated luminous flux of an intensity of $10^2 - 10^3$ W/sq cm emitted from the optical heating assembly 1, resulting in heating of the surface of the silicon plate up to about 1200° C. Within a period of 10 minutes, the surface of the silicon plate was completely cleaned from a damaged layer of oxide film and adsorbed impurities and the structure of the surface layer of the plate was improved. In the course of heating the substrate 12 (silicon plate) with a concentrated flux from the light source 3, a proportioned mixture of purified hydrogen with silicon tetrachloride enriched with phosphorus chloride was introduced into the same reaction furnace 2 through the tube 13. Since the silicon plate was disposed perpendicular to the luminous flux from the assembly 1, the growth surface was heated to a higher temperature than the mass of the substrate. This made it possible to provide a heat sink through the substrate which created a temperature gradient over the thickness of the plate favoring crystallization. The following operating conditions were set for growing a 150–200 μ thick silicon plate: a thermal gradient over the plate thickness 250° – 300° C/cm, film growth temperature 1000°–1200° C, silicon tetrachloride/hydrogen molar ratio 0.01 – 0.6, hydrogen flow rate 1 – 300 l/hr, growth time 30–45 min.

In another quartz tube, an alloy of 99% gold and 1% antimony was prepared in an argon atmosphere at a temperature of 1100° C. The alloy produced in the form of a ball was rolled into a foil sheet, 50 μ thick. After that, the silicon substrate with a grown alloy film was taken out of the quartz chamber 5 and the surface of the grown silicon film was degreased and etched in hydrofluoric acid. Then, the alloy foil sheet was pressed to the degreased surface of the grown silicon film by means of a graphite clip and the entire system was placed into a quartz furnace evacuated to a pressure not worse than $10^{-4} - 10^{-5}$ torr. The furnace was turned on and antimony-enriched gold was fused with the grown layer during 6–10 minutes at temperatures about 720°–750° C with continuous evacuation. After that, the furnace was turned off and the sample gradually cooled down to room temperature.

This growth method produced a mirror-finish monocrystalline silicon film on a silicon substrate; between the substrate and the grown film there were no high-resistance layers which, in conventional methods of film growth for a contact degraded its quality due to injection from the contact.

An apparatus for epitaxial growing of semiconductor films in a closed system illustrated in FIG. 2 is mainly intended for producing films from semiconductor compounds of the formulations $A_2B_6$ and $A_4B_6$ on semiconductor substrates and for producing on this basis multilayer structures with well defined junctions.

This apparatus, in accordance with the second embodiment of the invention, operates as follows.

The source growth material 26 is placed into a vaporizer. The precleaned substrate 12 made of semiconductor material is positioned onto the working surface 10 of the support 25. After that the quartz chamber (tubes 17, 20) is connected to the cylindrical metal section 22 and sealed by the gland 23. Then, the quartz chamber (tubes 17, 20) is evacuated and filled with a neutral or reducing atmosphere through the tube 2. The optical heating assembly 1 is switched on and a powerful luminous flux is emitted therefrom through the quartz glass 18 onto the surface of the support 12 intended for epitaxy. Then, the source furnaces 33 and 34 are turned on for supplying the source material to the substrate 12 in a gaseous state. The coolant source 32 is also turned on, the coolant starts flowing through the tube 31 into the inner quartz chamber 30 and cools the opposite side of the working surface 10 of the substrate support 25. This operation enables cooling of the substrate surface opposite to the surface exposed to the luminous flux down to temperatures that prevent diffusion between the grown film and the substrate substances, and production of semiconductor structures with well defined junctions.

The cooling temperature is selected to be the maximum possible with a view to obtaining maximum possible thermal gradients from the epitaxial surface inwards, however, this temperature must not reduce a critical epitaxy temperature on the substrate surface exposed to the luminous flux. The described arrangement for heating one side of the substrate 12 with the luminous flux in combination with cooling of the opposite side thereof provides thermal gradients inside the substrate as large as 3000° C due to which epitaxial semiconductor structures with well defined junctions may be produced using any compounds.

operating conditions were established the intensity of the luminous flux from the xenon lamp was increased three-fold during 2-5 seconds. As a result, cadmium telluride layers grown in non-steady-state operation were removed and the surface was cleaned for growing a film with required properties. Then, the support 25 was inserted inward until a contact with the conical expansion 21, and hydrogen pressure in the space II raised so that it was 0.05-0.1 atm. higher than the pressure in the space I, thereby sealing the space I (working space for epitaxial growth), and the film was further grown in controlled conditions. The thickness of the films ranged from 10 to 800 $\mu$ depending on the growth time and conditions. The maximum growth rate for a monocrystalline film reached 800 $\mu$/hr. By varying the cadmium vapor temperature from 400° to 650° C, the type of conductivity and carrier concentration in the film could be varied from $1.10^{17}$ cm$^{-3}$ (p-type) to $4.10^{16}$ cm$^{-3}$ (n-type) which is illustrated in the table below.

Table

| Sample number | Alloying | Temperature of cadmium telluride source | Temperature of volatile component | | Type of conductivity | Carrier concentration |
|---|---|---|---|---|---|---|
| 1. | Undoped | 820 | Cd | 400° C | p | $1.4\ 10^{17}$ cm$^{-3}$ |
| 2. | Undoped | 820 | Cd | 410° C | p | $5.10^{16}$ cm$^{-3}$ |
| 3. | Undoped | 820 | Cd | 450° C | p | $1.10^{13}$ cm$^{-3}$ |
| 4. | Undoped | 820 | Cd | 520° C | n | $2.10^{14}$ cm$^{-3}$ |
| 5. | Undoped | 820 | Cd | 600° C | n | $7.5\ 10^{14}$ cm$^{-3}$ |
| 6. | Undoped | 820 | Cd | 650° C | n | $4.10^{16}$ cm$^{-3}$ |
| 7. | Doped with Cl$_2$ | 820 | CdCl$_2$ | 400° C | p | $8.6\ 10^{15}$ cm$^{-3}$ |
| 8. | Doped with Cl$_2$ | 820 | CdCl$_2$ | 560° C | n | $1.10^{14}$ cm$^{-3}$ |
| 9. | Doped with Cl$_2$ | 820 | CdCl$_2$ | 500° C | n | $2.10^{15}$ cm$^{-3}$ |
| 10. | Doped with In | 820 | Te | 200° C | n | $2.10^{15}$ cm$^{-3}$ |
| 11. | Doped with Sn | 820 | Te | 400° C | n | $6.10^{14}$ cm$^{-3}$ |
| 12. | Doped with Sn | 820 | Te | 500° C | n | $1.10^{14}$ cm$^{-3}$ |
| 13. | Doped with Sn | 820 | Te | 620° C | n | $5.10^{13}$ cm$^{-3}$ |

The illustrated embodiment of the invention will become more readily apparent from the concrete examples of producing p-n junctions from compounds with the formulation A$_2$B$_6$ (CdTe) and A$_4$B$_6$ (PbSnTe).

EXAMPLE 2

Growing epitaxial p-n films from CdTe.

3-5 g of pure or alloyed cadmium telluride were placed into the vaporizer of the working space I. The mechanically polished cadmium telluride substrate 12, sized 1×1 cm and 1.5 mm thick, was placed onto the working surface of the support 25. The volatile Cd or Te constituent element 29 was introduced into the Knudsen cell 28 and the cell was sealed at one end. The tube 20 was connected to the cylindrical metal section 22 via the airtight rubber ring 23. Through the tube 24, the quartz chamber was evacuated and filled with pure hydrogen. After that, the power supply of the optical heating assembly 1 was switched on and the assembly 1 emitted an intensive luminous flux onto the surface of the substrate 12 intended for epitaxy. At the same time the opposite side of the substrate 12 was cooled by a coolant introduced into the chamber 30. The luminous flux intensity cooling was regulated so that the temperature under the substrate did not exceed 360° C in steady-state operation of the apparatus. Then, the source furnaces 33 and 34 were started up. 15 minutes after startup of the furnaces 33 and 34, the following temperatures were established in the reaction furnace 16; 820° C at the cadmium telluride vaporizer, 360° C under the substrate 12, whereas the temperature of the volatile Cd component 29 varied from 400° to 650° C depending on the desired properties of the film. After steady-state For producing p-n junctions, CdTe p-type substrates were used with the concentration of the carriers of $4.10^{16}$ cm$^{-3}$, $\mu = 60$ cm$^2$/V sec, where $\mu$ is mobility of the carriers.

The films with the characteristics given in the Table were grown on the above substrates in three different processes:

(a) by vaporizing pure material under the pressure of CdCl$_2$ vapors at temperatures of 400°-560° C, (b) by vaporizing pure material of a stoichiometric composition at a Cd vapor pressure at 400°-650° C, (c) by vaporizing In-enriched material at different vapor Te pressures.

In the latter case, n-type films with a carrier concentration of $2.10^{15}$ cm$^{-3}$ to $5.10^{13}$ cm$^{-13}$ could be obtained by varying the pressure of tellurium vapors from 0° to 650° C.

The current-voltage characteristics of p-n junctions (FIG. 3) for the above three versions are identical. P$^+$-p, n$^+$- n and heterostructures were produced using the same process technology.

The epitaxially produced monocrystalline cadmium telluride layers of n$^+$ - n, p - n and p$^+$ - p structures had an ideally smooth surface which obviated the need for any additional treatment for further use.

EXAMPLE 3

Growing of epitaxial films of A$_4$B$_6$ compounds illustrated by the example of producing p-n junctions from PbSnTe for infrared detectors and PbTe-PbSnTe heterojunctions for injection lasers.

Ten to twelve g of Bi-doped PbTe were placed in the reaction furnace 16, and the oriented p-type Pb$_{0.8}$Sn$_{0.2}$Te substrate 12 mechanically polished and etched in a Br$_2$ + HBr solution was positioned onto the cooled support 25.

The semiconductor film was grown identically to example 2, but the growth conditions were different: the temperature of the vaporized source material (PbTe) did not exceed 700° C and the temperature under the substrate was about 350° C. The film growth rate in these conditions was about 100 μ/hr. This process was used for reproducible growing of heterostructures for injection lasers with a wavelength of about 10.6μ.

p-n junctions on the basis of Pb$_{0.8}$Sn$_{0.2}$Te were produced similarly, the charge mixture being n-type Pb$_{0.8}$Sn$_{0.2}$Te compound doped with Bi, while the substrate was p-type Pb$_{0.8}$Sn$_{0.2}$Te material.

The current-voltage characteristic of the p-n junction produced is shown in FIG. 4.

What is claimed is:

1. A vapor phase method for growing epitaxial semiconductor films, in an enclosed chamber, of silicon and the type selected from the group consisting of monocrystalline, A$_2$B$_6$ and A$_4$B$_6$ on a substrate with a support which does not absorb radiant heat comprising: heating a working surface of said substrate in an inert atmosphere to a critical epitaxy temperature by means of radiant light having a luminous flux intensity from about $10^1$ to $10^4$ watts per square centimeter of substrate surface, said critical temperature sufficient to enable epitaxial growth on the working surface of said substrate; introducing a gaseous source material capable of forming a film on the working surface of said substrate exposed to the radiant light, while simultaneously force cooling the opposite side of the working surface of the substrate to a temperature gradient sufficient to prevent mutual diffusion between the film being deposited on the working surface of the substrate, and the substrate components.

2. The method of claim 1, wherein said semiconductor films are selected from the group consisting of HgCdTe, CdTe, PbTe, and PbSnTe.

3. The method of claim 1, wherein said semiconductor film is Si.

4. The method of claim 2, wherein said semiconductor film is CdTe.

5. The method of claim 2, wherein said semiconductor film is selected from the groups consisting of PbSnTe and PbTe.

* * * * *